(12) United States Patent
Orimoto

(10) Patent No.: US 10,483,183 B2
(45) Date of Patent: Nov. 19, 2019

(54) SEMICONDUCTOR DEVICE

(71) Applicant: TOYOTA JIDOSHA KABUSHIKI KAISHA, Toyota-shi, Aichi-ken (JP)

(72) Inventor: Norimune Orimoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/164,112

(22) Filed: Oct. 18, 2018

(65) Prior Publication Data

US 2019/0157178 A1 May 23, 2019

(30) Foreign Application Priority Data

Nov. 22, 2017 (JP) ................................. 2017-224731

(51) Int. Cl.
| | |
|---|---|
| H01L 23/58 | (2006.01) |
| H01L 29/10 | (2006.01) |
| H01L 23/367 | (2006.01) |
| H01L 23/492 | (2006.01) |
| H01L 21/66 | (2006.01) |
| H01L 23/373 | (2006.01) |
| H01L 23/433 | (2006.01) |
| H01L 23/42 | (2006.01) |

(52) U.S. Cl.
CPC ............ *H01L 23/367* (2013.01); *H01L 22/34* (2013.01); *H01L 23/373* (2013.01); *H01L 23/3735* (2013.01); *H01L 23/4334* (2013.01); *H01L 23/492* (2013.01); *H01L 23/42* (2013.01); *H01L 2224/32245* (2013.01); *H01L 2224/33* (2013.01); *H01L 2924/181* (2013.01)

(58) Field of Classification Search
USPC ... 257/48, 98, 692, 737, 314, 513, 675, 676, 257/773, 774, 88, 89, 99; 438/110, 107, 438/112, 114, 122, 28, 778
See application file for complete search history.

(56) References Cited

U.S. PATENT DOCUMENTS

2012/0228776 A1    9/2012  Ohno

FOREIGN PATENT DOCUMENTS

| JP | 2013-113638 A | 6/2013 |
|---|---|---|
| WO | 2011/142013 A1 | 11/2011 |
| WO | 2011142013 | * 11/2011 |

* cited by examiner

*Primary Examiner* — Niki H Nguyen
(74) *Attorney, Agent, or Firm* — Oliff PLC

(57) ABSTRACT

A semiconductor device may include a semiconductor element; a temperature detecting element provided at a central part of a surface of the semiconductor element, and a heat conductor jointed to the surface of the semiconductor element via a jointing element. The jointing element may include a central part positioned over the temperature detecting element, and a peripheral part positioned on a periphery of the central part of the jointing element. The heat conductor may include a metal part being in contact with the central part of the jointing element, and a graphite part being in contact with the peripheral part of the jointing element.

4 Claims, 17 Drawing Sheets

SEMICONDUCTOR DEVICE

CROSS-REFERENCE

This application claims priority to Japanese Patent Application No. 2017-224731 filed on Nov. 22, 2017, the contents of which are hereby incorporated by reference into the present application.

TECHNICAL FIELD

The technology disclosed herein relates to a semiconductor device.

BACKGROUND

A semiconductor device described in International Publication No. 2011/142013 includes a semiconductor element and a heat conductor jointed to a surface of the semiconductor element via a jointing element. When this semiconductor device operates, heat is generated in the semiconductor element and conducted to the heat conductor via the jointing element.

SUMMARY

In the semiconductor device of International Publication No. 2011/142013, when the heat generated in the semiconductor element is conducted to the heat conductor via the jointing element, a temperature of the jointing element rises. Distortion may thereby be caused in the jointing element. The distortion in the jointing element tends to be greater in a peripheral part of the joining element than in a central part thereof. Therefore, the distortion may cause cracks in the peripheral part of the jointing element.

Moreover, the semiconductor device may include a temperature detecting element configured to detect a temperature of the semiconductor element. The temperature detecting element is often provided at a central part of the surface of the semiconductor element. In such a semiconductor device, if cracks occur in a peripheral part of a jointing element, a temperature of the peripheral part of the jointing element may rise more than expected due to an influence of the cracks. When this happens, the temperature rise in the peripheral part of the jointing element may influence the temperature of the semiconductor element, which may result in a failure to accurately detect the temperature of the semiconductor element.

The disclosure herein provides a technology capable of suppressing distortion in a peripheral part of a jointing element and accurately detecting a temperature of a semiconductor element.

A semiconductor device disclosed herein may comprise a semiconductor element, a temperature detecting element provided at a central part of a surface of the semiconductor element, and a heat conductor jointed to the surface of the semiconductor element via a jointing element. The jointing element may comprise a central part positioned over the temperature detecting element, and a peripheral part positioned on a periphery of the central part of the jointing element. The heat conductor may comprise a metal part being in contact with the central part of the jointing element, and a graphite part being in contact with the peripheral part of the jointing element.

According to this configuration, when the semiconductor device operates, heat is generated in the semiconductor element. The heat generated in the semiconductor element is conducted to the heat conductor via the jointing element. At this time, a temperature of the jointing element rises. In the configuration above, the heat conductor includes the metal part being in contact with the central part of the jointing element, and the graphite part being in contact with the peripheral part of the jointing element. Graphite has heat conductivity higher than heat conductivity of metal. Therefore, when the temperature of the jointing element rises, heat in the peripheral part of the jointing element is conducted with high heat conductivity to the graphite part of the heat conductor. The temperature rise in the peripheral part of the jointing element can thereby be suppressed. Consequently, distortion of the peripheral part of the jointing element can be suppressed. Moreover, influence on a temperature of the semiconductor element can be suppressed. Therefore, the temperature of the semiconductor element can be detected accurately.

The semiconductor device may further comprise a plurality of metal wires embedded in the jointing element. The plurality of metal wires may be arranged along the peripheral part of the jointing element when viewed in a direction orthogonal to the surface of the semiconductor element.

A plurality of recesses may be provided in the graphite part. The jointing element may fill each of the recesses.

A semiconductor device disclosed herein may comprise a semiconductor element, a temperature detecting element provided at a central part of a surface of the semiconductor element, a heat conductor jointed to the surface of the semiconductor element via a jointing element, and a plurality of metal wires embedded in the jointing element. The jointing element may comprise a central part positioned over the temperature detecting element, and a peripheral part positioned on a periphery of the central part of the jointing element. The plurality of metal wires may be arranged along the peripheral part of the jointing element when viewed in a direction orthogonal to the surface of the semiconductor element.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
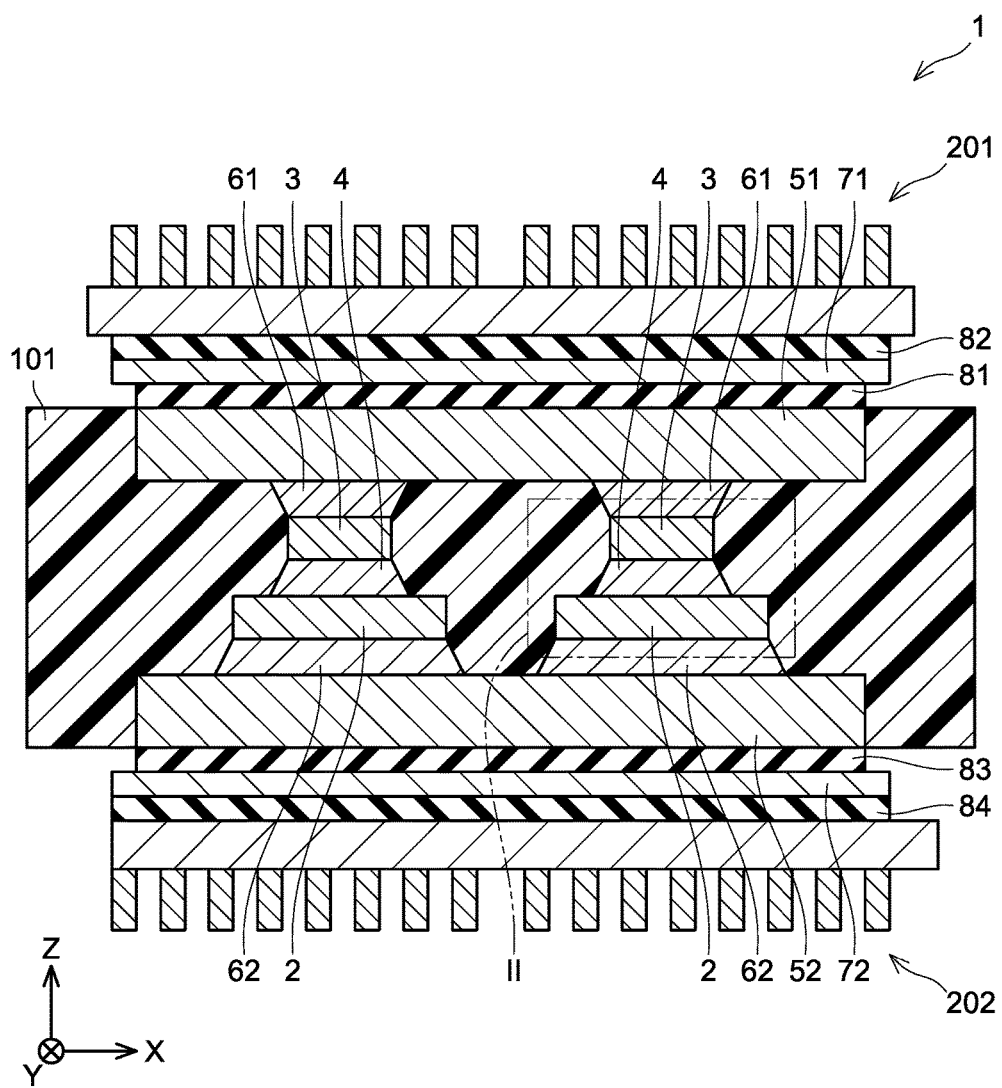
FIG. 1 is a cross-sectional view of a semiconductor device according to a first embodiment.

A semiconductor device 1 according to a first embodiment will be described with reference to the drawings. As illustrated in FIG. 1, the semiconductor device 1 according to the first embodiment includes semiconductor elements 2, intermediate jointing elements 4, and heat conductors 3. Moreover, the semiconductor device 1 includes upper jointing elements 61, an upper heat radiator 51, lower jointing elements 62, a lower heat radiator 52, and a sealing resin 101.

Figure 2:
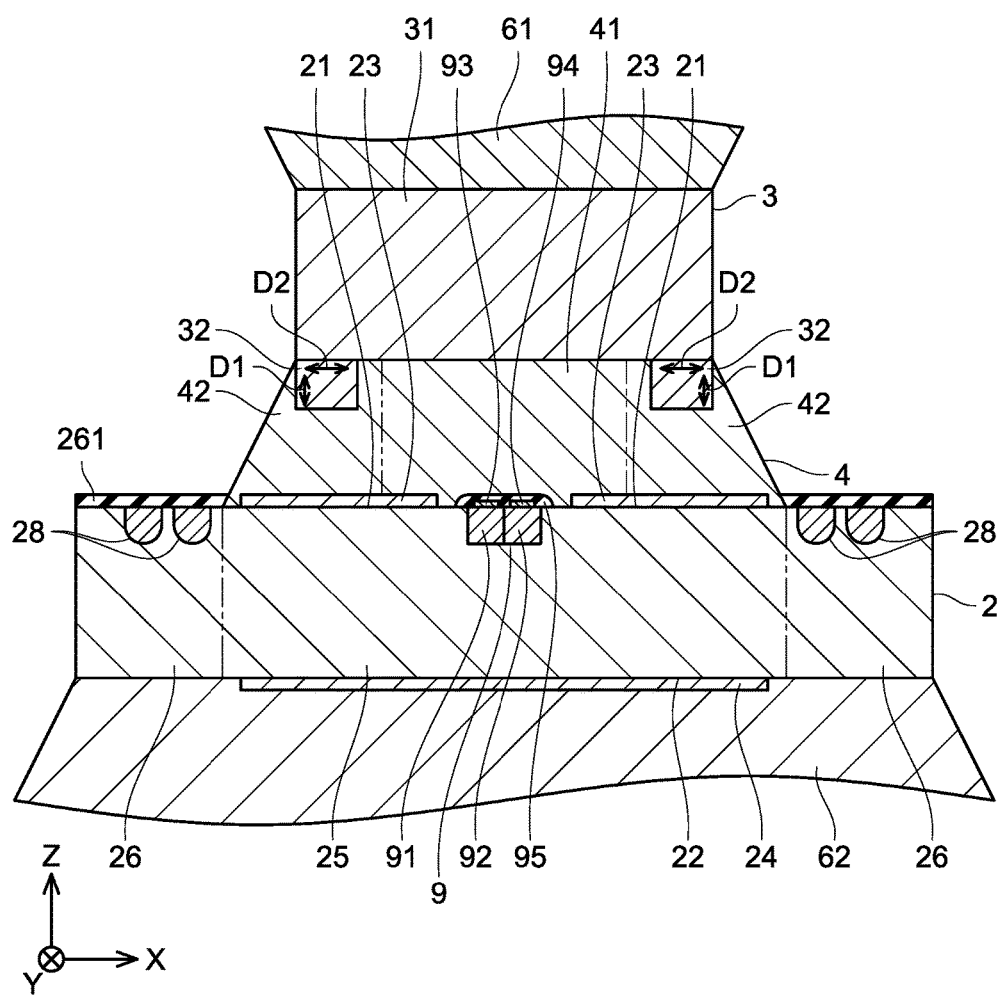
FIG. 2 is an enlarged view of a main part II in FIG. 1.

Each semiconductor element 2 is constituted of a substrate, for example, silicon (Si) or silicon carbide (SiC). As illustrated in FIG. 2, the semiconductor element 2 includes an element region 25 and a peripheral region 26. The element region 25 is provided at a central part of the semiconductor element 2. The element region 25 includes an element structure such as an IGBT (Insulated Gate Bipolar Transistor) or a MOSFET (Metal Oxide Semiconductor Field Effect Transistor). In a case where the element structure is an IGBT, for example, the element region 25 includes emitter regions, a collector region, a body region, a drift region, a gate electrode, and the like (not illustrated). The element region 25 includes a plurality of element structures. Illustration in FIG. 2 omits the sealing resin 101.

Moreover, a temperature detecting element 9 is provided in the element region 25 of the semiconductor element 2. The temperature detecting element 9 is provided at a central part of the element region 25. The temperature detecting element 9 is provided at a central part of a front surface 21 of the semiconductor element 2. The temperature detecting element 9 is, for example, a diode. The temperature detecting element 9 includes an anode region 91 and a cathode region 92 that constitute a diode. The temperature detecting element 9 is an element for detecting a temperature of the semiconductor element 2 by utilizing temperature characteristics of the diode. The temperature of the semiconductor element 2 can be detected by measuring a forward voltage of the diode while a current flowing through the temperature detecting element 9 is maintained to be constant. When the semiconductor device 1 operates, the semiconductor element 2 generates heat.

An anode electrode 93 and a cathode electrode 94 are disposed on the front surface 21 of the semiconductor element 2. The anode electrode 93 is disposed on the anode region 91 of the temperature detecting element 9. The anode electrode 93 covers the anode region 91. The anode electrode 93 is electrically continuous with the anode region 91. The cathode electrode 94 is disposed on the cathode region 92 of the temperature detecting element 9. The cathode electrode 94 covers the cathode region 92. The cathode electrode 94 is electrically continuous with the cathode region 92. Current flows in the temperature detecting element 9 through the anode electrode 93 and the cathode electrode 94. The anode electrode 93 and the cathode electrode 94 are constituted of, for example, aluminum-silicon alloy (AlSi). The anode electrode 93 and the cathode electrode 94 are covered with an insulating film 95. The anode electrode 93 and the cathode electrode 94 are insulated from the intermediate jointing element 4 by the insulating film 95.

The anode electrode 93 and the cathode electrode 94 are electrically connected to a temperature detector, which is not illustrated. The temperature detecting element 9 provided in the element region 25 of the semiconductor element 2 is electrically connected to the temperature detector through the anode electrode 93 and the cathode electrode 94. The temperature detector detects the temperature of the semiconductor element 2 by measuring a forward voltage in the temperature detecting element 9.

Moreover, a plurality of front surface electrodes 23 is disposed on the front surface 21 of the semiconductor element 2. Each of the front surface electrodes 23 is disposed on the element region 25 of the semiconductor element 2. Each front surface electrode 23 covers the front surface 21 of the semiconductor element 2 in the element region 25. Each front surface electrode 23 is constituted of, for example, aluminum-silicon alloy (AlSi). Each front surface electrode 23 is electrically continuous with, for example, corresponding one of the emitter regions (not illustrated) provided in the element region 25 of the semiconductor element 2. Current flows in the emitter regions through the front surface electrodes 23.

Moreover, a rear surface electrode 24 is disposed on a rear surface 22 of the semiconductor element 2. The rear surface electrode 24 is disposed under the element region 25 of the semiconductor element 2. The rear surface electrode 24 covers the rear surface 22 of the semiconductor element 2 in the element region 25. The rear surface electrode 24 is constituted of, for example, nickel (Ni). The rear surface electrode 24 is electrically continuous with, for example, the collector region (not illustrated) provided in the element region 25 of the semiconductor element 2. Current flows in the collector region through the rear surface electrode 24.

The peripheral region 26 of the semiconductor element 2 is provided on a periphery of the element region 25. The peripheral region 26 includes a peripheral high-breakdown voltage structure (terminal structure) such as an FLR (Field Limiting Ring). The peripheral region 26 includes a plurality of field limiting ring regions 28. The front surface 21 of the semiconductor element 2 in the peripheral region 26 is covered with an insulating film 261.

The heat conductor 3 is jointed to the semiconductor element 2 via the intermediate jointing element 4 on a front surface side of the semiconductor element 2. The intermediate jointing element 4 fills a space between the semiconductor element 2 and the heat conductor 3. The intermediate jointing element 4 fills the space at a position that overlaps the element region 25 of the semiconductor element 2 in a Z direction. The intermediate jointing element 4 joints the semiconductor element 2 and the heat conductor 3. The intermediate jointing element 4 covers the plurality of front surface electrodes 23 disposed on the front surface 21 of the semiconductor element 2. The intermediate jointing element 4 is fixed to the plurality of front surface electrodes 23. The intermediate jointing element 4 is electrically continuous with each front surface electrode 23.

A material that can be used for the intermediate jointing element 4 is, for example, solder. The solder is, for example, Sn-based solder, SnCu-based solder, Zn-based solder, and the like. Moreover, a material that can be used for the intermediate jointing element 4 is, for example, a brazing material. The brazing material is, for example, an Ag-based brazing material.

The intermediate jointing element 4 includes a central part 41 and a peripheral part 42. The central part 41 of the intermediate jointing element 4 is positioned so as to overlap the temperature detecting element 9 in the Z direction. The central part 41 covers the insulating film 95 disposed on the temperature detecting element 9. The peripheral part 42 of the intermediate jointing element 4 is positioned on a periphery of the central part 41. The peripheral part 42 surrounds the central part 41. The peripheral part 42 is positioned so as to overlap each front surface electrode 23 in the Z direction. The peripheral part 42 is positioned so as not to overlap the temperature detecting element 9 in the Z direction.

The heat conductor 3 which is jointed to the front surface 21 of the semiconductor element 2 via the intermediate jointing element 4 is disposed at a position that overlaps the element region 25 of the semiconductor element 2 in the Z direction. The heat conductor 3 is disposed at a position that overlaps the anode electrode 93, the cathode electrode 94, and each front surface electrode 23 in the Z direction. The heat conductor 3 is disposed at a position that does not overlap the peripheral region 26 of the semiconductor element 2 in the Z direction. The heat conductor 3 is jointed to each front surface electrode 23 via the intermediate jointing element 4. The heat conductor 3 is electrically continuous with each front surface electrode 23. The heat conductor 3 is disposed between the semiconductor element 2 and the upper heat radiator 51 (see FIG. 1). The heat conductor 3 has a function as a spacer for ensuring a space between the semiconductor element 2 and the upper heat radiator 51. The heat conductor 3 may partially overlap the peripheral region 26 of the semiconductor element 2 in the Z direction.

The heat conductor 3 includes a metal part 31 and a graphite part 32. The metal part 31 has a plate shape. The metal part 31 has electrical conductivity and heat conductivity. The metal part 31 is constituted of, for example, copper (Cu). Copper (Cu) has a heat conductivity of approximately 390 W/m·K. The metal part 31 may be constituted of metal other than copper (Cu).

The graphite part 32 of the heat conductor 3 is constituted of graphite. The graphite part 32 is jointed to a rear surface of the metal part 31. The graphite part 32 protrudes downward from the metal part 31. The graphite part 32 is jointed to a peripheral part of the metal part 31. The graphite part 32 is not jointed to a central part of the metal part 31. The graphite part 32 is jointed to the metal part 31 via a jointing element such as solder or a brazing material. The graphite part 32 is disposed at a position that overlaps the element region 25 of the semiconductor element 2 in the Z direction. The graphite part 32 is disposed at a position that overlaps each front surface electrode 23 in the Z direction. The graphite part 32 is disposed at a position that does not overlap the temperature detecting element 9 in the Z direction. The graphite part 32 is disposed at a position that does not overlap the anode electrode 93 or the cathode electrode 94 in the Z direction. The graphite part 32 is disposed at a position that does not overlap the peripheral region 26 of the semiconductor element 2 in the Z direction. The graphite part 32 is disposed on inner side with respect to the peripheral region 26 of the semiconductor element 2. The graphite part 32 is positioned on the inner side with respect to the plurality of field limiting ring regions 28 provided in the peripheral region 26.

Figure 3:
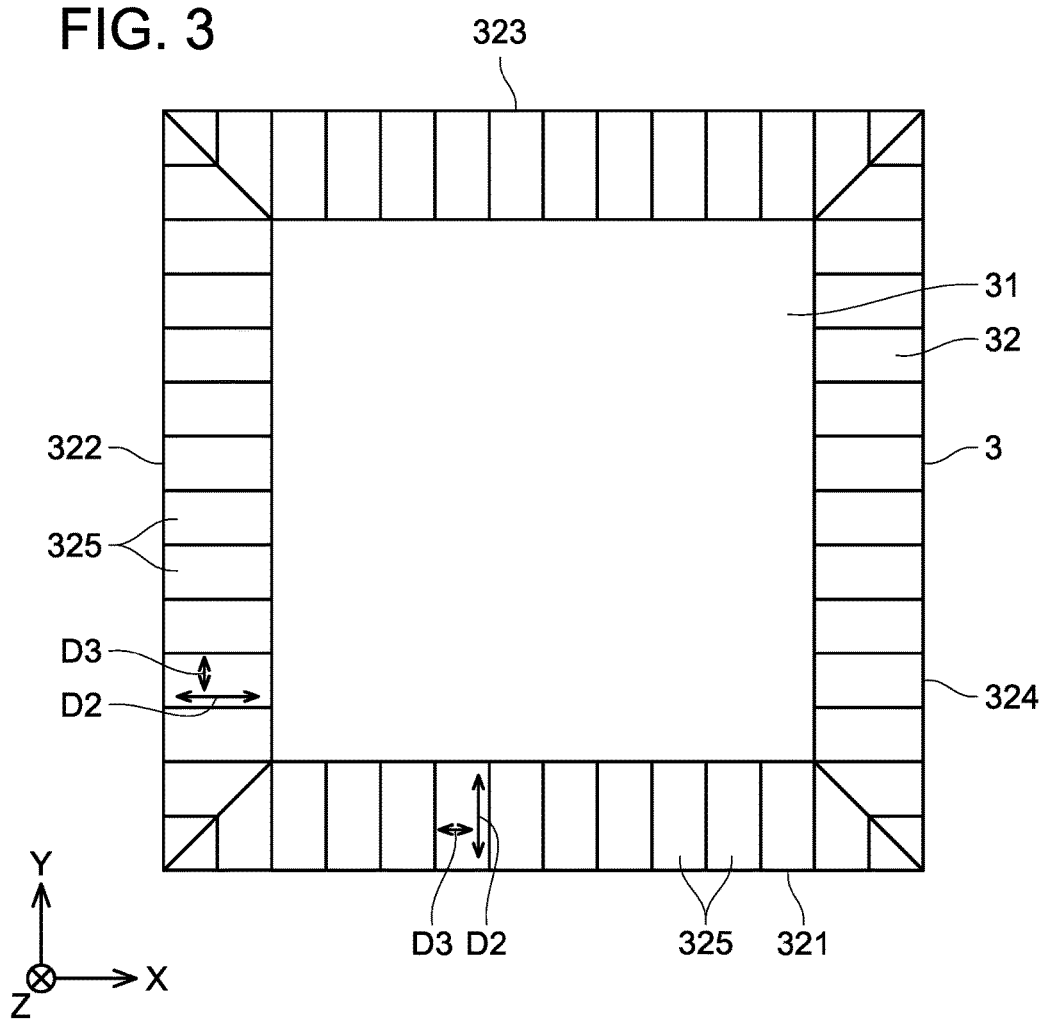
FIG. 3 is a diagram of a heat conductor according to the first embodiment when viewed in a direction orthogonal to a surface of a semiconductor element (the diagram shows a rear surface of the heat conductor).

FIG. 3 is a diagram of the heat conductor 3 when viewed in a direction (the Z direction) orthogonal to the front surface 21 of the semiconductor element 2 (the diagram shows a rear surface of the heat conductor 3). As illustrated in FIG. 3, the graphite part 32 extends along a perimeter direction of the metal part 31. The graphite part 32 has a ring shape along the perimeter direction of the metal part 31. The graphite part 32 includes a first member 321, a second member 322, a third member 323, and a fourth member 324. The first member 321 and the third member 323 extend in an X direction. The second member 322 and the fourth member 324 extend in a Y direction. Each of the members 321, 322, 323, and 324 has its both ends cut diagonally.

As illustrated in FIG. 2, the graphite part 32 is in contact with the peripheral part 42 of the intermediate jointing element 4. The graphite part 32 is covered by the peripheral part 42 of the intermediate jointing element 4. The graphite part 32 is embedded in the peripheral part 42 of the intermediate jointing element 4. The graphite part 32 extends along a perimeter direction of the peripheral part 42 of the intermediate jointing element 4. The graphite part 32 is not in contact with the central part 41 of the intermediate jointing element 4. The graphite part 32 surrounds the central part 41 of the intermediate jointing element 4. A portion of the intermediate jointing element 4 surrounded by the graphite part 32 is in contact with the rear surface of the metal part 31. The intermediate jointing element 4 is in contact with the rear surface of the metal part 31 except at the graphite part 32. The intermediate jointing element 4 is in contact with a portion of the metal part 31 to which the graphite part 32 is not jointed. The metal part 31 is in contact with the central part 41 of the intermediate jointing element 4.

As illustrated in FIG. 3, the graphite part 32 includes a plurality of graphite layers 325. The graphite part 32 is formed by the plurality of graphite layers 325 being stacked. Each of the graphite layers 325 is formed by a plurality of graphene layers (not illustrated) being stacked. The plurality of graphite layers 325 is stacked along the perimeter direction of the metal part 31.

Figure 4:
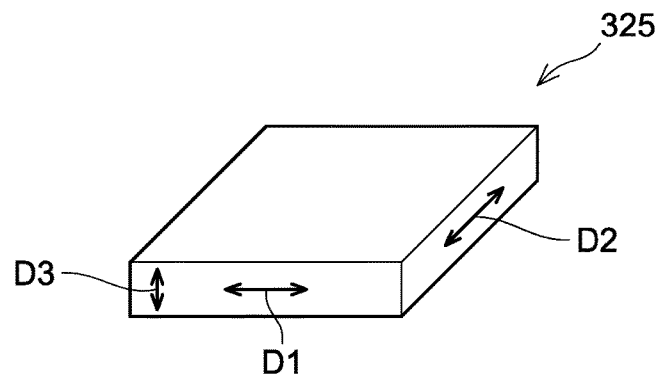
FIG. 4 is a perspective view of each graphite layer according to the first embodiment.

Each graphite layer 325 has electrical conductivity and heat conductivity. Each graphite layer 325 has anisotropic heat conductivity because of a bonding relation of carbon atoms. The heat conductivity is relatively high in a direction, and is relatively low in another direction. As illustrated in FIG. 4, the heat conductivity of each graphite layer 325 in its in-plane directions (a first high heat-conductivity direction D1 and a second high heat-conductivity direction D2) is higher than the heat conductivity in its out-plane direction (a low heat-conductivity direction D3). The heat conductivity in the first high heat-conductivity direction D1 and the second high heat-conductivity direction D2 is approximately 800 to 1900 W/m·K. The heat conductivity in the low heat-conductivity direction D3 is approximately 3 to 10 W/m·K. The first high heat-conductivity direction D1, the second high heat-conductivity direction D2, and the low heat-conductivity direction D3 are orthogonal to each other. The out-plane direction (the low heat-conductivity direction D3) of the graphite layers 325 is a thickness direction of the graphite layers 325.

As illustrated in FIG. 2, each graphite layer 325 is disposed such that its first high heat-conductivity direction D1 is along the Z direction (a direction in which the semiconductor element 2 and the heat conductor 3 are arranged). Moreover, as illustrated in FIG. 3, each graphite layer 325 is disposed such that its low heat-conductivity direction D3 is along the perimeter direction of the metal part 31. Each graphite layer 325 is disposed such that its second high heat-conductivity direction D2 is along a direction from the central part of the metal part 31 toward the peripheral part of the metal part 31.

As illustrated in FIG. 1, the upper heat radiator 51 is jointed to the heat conductors 3 via the upper jointing elements 61 on a front surface side of the heat conductors 3. Each of the upper jointing elements 61 fills a space between its corresponding heat conductor 3 and the upper heat radiator 51. The upper jointing elements 61 joint the heat conductors 3 and the upper heat radiator 51. A material that can be used for the upper jointing elements 61 is, for example, solder. Examples of the solder include Sn-based solder, SnCu-based solder, Zn-based solder, and the like. Moreover, a material that can be used for the upper jointing elements 61 is, for example, a brazing material. An example of the brazing material includes an Ag-based brazing material.

A material that can be used for the upper heat radiator 51 above the heat conductors 3 is, for example, copper (Cu) or aluminum (Al). The upper heat radiator 51 has heat conductivity and electrical conductivity. The upper heat radiator 51 has a function of radiating heat generated in the semiconductor elements 2. Moreover, the upper heat radiator 51 has a function as an electrode.

An upper insulating plate 71 is disposed above the upper heat radiator 51 via a thermal grease 81. Moreover, an upper cooler 201 is disposed above the upper insulating plate 71 via a thermal grease 82. Each thermal grease 81, 82 has heat conductivity. Each thermal grease 81, 82 is, for example, a viscous liquid obtained by mixing a filler into silicon.

The upper insulating plate 71 has heat conductivity. The upper insulating plate 71 insulates the upper heat radiator 51 and the upper cooler 201 from each other. The upper cooler 201 is, for example, a water-cooling cooler. Inside the upper cooler 201, coolant water flows. The upper cooler 201 cools the semiconductor elements 2 via the upper insulating plate 71, the upper heat radiator 51, the heat conductors 3, and the like.

The lower heat radiator 52 is jointed to the semiconductor elements 2 via the lower jointing elements 62 on a rear surface side of the semiconductor elements 2. Each of the lower jointing elements 62 fills a space between its corresponding semiconductor element 2 and the lower heat radiator 52. The lower jointing elements 62 joint the semiconductor elements 2 and the lower heat radiator 52. A material that can be used for the lower jointing elements 62 is, for example, solder. Examples of the solder include Sn-based solder, SnCu-based solder, Zn-based solder, and the like. Moreover, a material that can be used for the lower jointing elements 62 is, for example, a brazing material. An example of the brazing material includes an Ag-based brazing material.

A material that can be used for the lower heat radiator 52 below the semiconductor elements 2 is, for example, copper (Cu) or aluminum (Al). The lower heat radiator 52 has heat conductivity and electrical conductivity. The lower heat radiator 52 has a function of radiating heat generated in the semiconductor elements 2. Moreover, the lower heat radiator 52 has a function as an electrode.

A lower insulating plate 72 is disposed below the lower heat radiator 52 via a thermal grease 83. Moreover, a lower cooler 202 is disposed below the lower insulating plate 72 via a thermal grease 84. Each thermal grease 83, 84 has heat conductivity. Each thermal grease 83, 84 is, for example, a viscous liquid obtained by mixing a filler into silicon.

The lower insulating plate 72 has heat conductivity. The lower insulating plate 72 insulates the lower heat radiator 52 and the lower cooler 202 from each other. The lower cooler 202 is, for example, a water-cooling cooler. Inside the lower cooler 202, coolant water flows. The lower cooler 202 cools the semiconductor elements 2 via the lower insulating plate 72, the lower heat radiator 52, and the like.

The semiconductor elements 2, the heat conductors 3, the upper heat radiator 51, and the lower heat radiator 52, which have been described above, are sealed by the sealing resin 101. The sealing resin 101 fills a space between the upper heat radiator 51 and the lower heat radiator 52. A material that can be used for the sealing resin 101 is an epoxy resin. The sealing resin 101 may additionally include a curing agent, a stress relaxing agent, a curing accelerator, a filler, and the like.

The semiconductor device 1 according to the first embodiment has been described above. As is clear from the description above, the semiconductor device 1 includes the semiconductor elements 2, the temperature detecting elements 9 provided at the central parts of the front surfaces 21 of the semiconductor elements 2, and the heat conductors 3 jointed to the front surfaces 21 of the semiconductor elements 2 via the intermediate jointing elements 4. Each of the intermediate jointing element 4 includes the central part 41 positioned over the temperature detecting element 9 and the peripheral part 42 positioned on the periphery of the central part 41. Each of the heat conductor 3 includes the metal part 31 being in contact with the central part 41 of the intermediate jointing element 4 and the graphite part 32 being in contact with the peripheral part 42 of the intermediate jointing element 4.

In this configuration, when the semiconductor device 1 operates, heat is generated in the semiconductor elements 2. The heat generated in the semiconductor elements 2 is conducted to the heat conductors 3 via the intermediate jointing elements 4. When the heat is conducted, a temperature of the intermediate jointing elements 4 rises. When the temperature of the intermediate jointing elements 4 rises, distortion is caused in the intermediate jointing elements 4. In the semiconductor device 1 described above, each of the heat conductors 3 includes the metal part 31 being in contact with the central part 41 of the intermediate jointing element 4 and the graphite part 32 being in contact with the peripheral part 42 of the intermediate jointing element 4. Graphite has heat conductivity higher than heat conductivity of metal. Therefore, in the configuration above, when the temperature of the intermediate jointing elements 4 rises, heat in the peripheral part 42 of each intermediate jointing element 4 is conducted with high heat conductivity to the graphite part 32 of the corresponding heat conductor 3 which is in contact with the peripheral part 42. Since the heat in the peripheral part 42 of each intermediate jointing element 4 is conducted to the graphite part 32 having high heat conductivity, the temperature rise in the peripheral part 42 of the intermediate jointing element 4 can be suppressed. Consequently, when distortion occurs in the intermediate jointing elements 4 by the temperature rise, distortion in the peripheral parts 42 of the intermediate jointing elements 4 can be suppressed. Moreover, since the temperature rise in the peripheral parts 42 of the intermediate jointing elements 4 can be suppressed, influence on the temperature of the semiconductor elements 2 can be reduced. Therefore, the temperature of the semiconductor elements 2 can be detected accurately.

Although one embodiment has been described above, specific aspects are not limited to the embodiment above. In the following description, configurations same as the configurations described above will be given the same signs, and description thereof will be omitted.

(First Variant)

Figure 5:
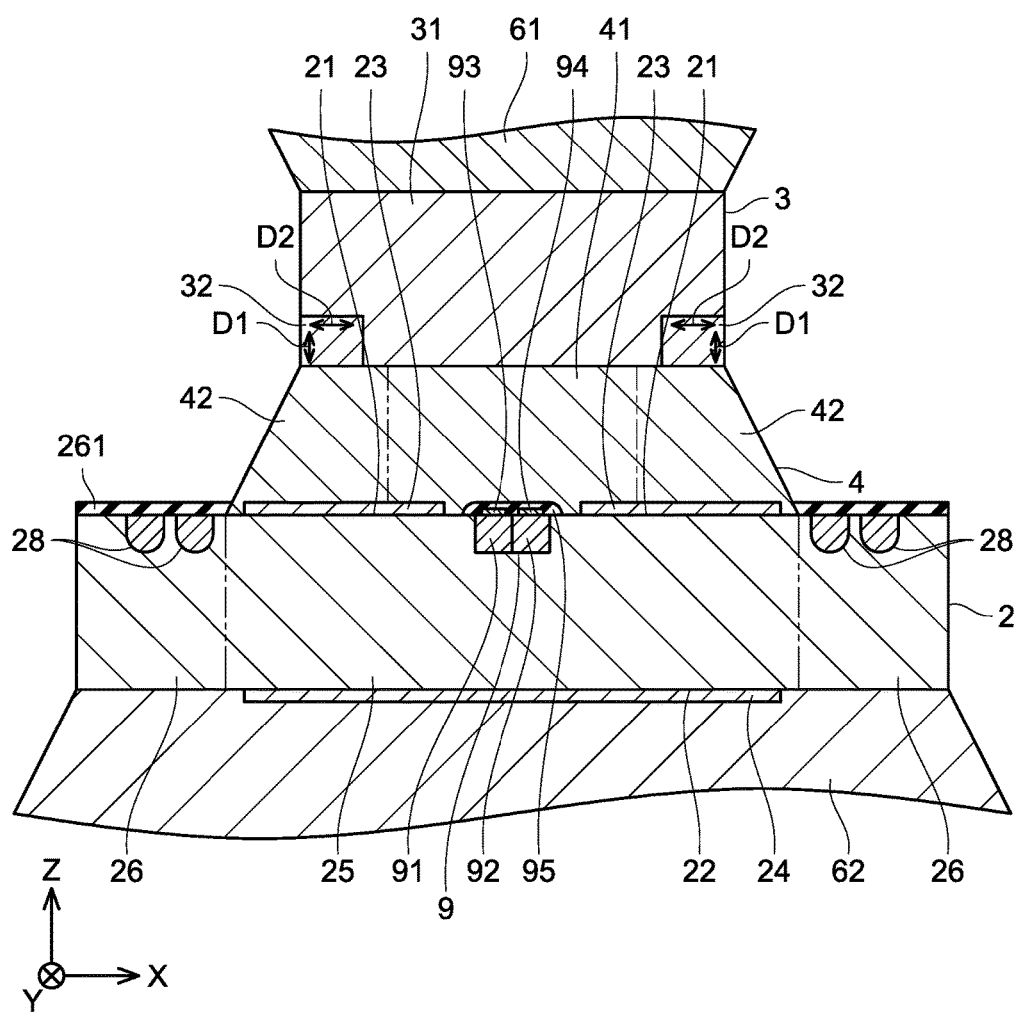
FIG. 5 is a cross-sectional view of a main part of a semiconductor device according to a first variant of the first embodiment.

As illustrated in FIG. 5, in the semiconductor device 1 according to a first variant of the first embodiment, the rear surface of the metal part 31 of the heat conductor 3 and a rear surface of the graphite part 32 are flush with each other. A rear surface of the heat conductor 3 is flat. The graphite part 32 surrounds a lower end portion of the metal part 31. The heat conductor 3 according to the first variant may be manufactured by fitting the metal part 31 into the graphite part 32 having a frame shape.

According to this configuration, a portion of each intermediate jointing element 4 that is in contact with the metal part 31 of the heat conductor 3 can have a thickness smaller than that in the configuration of the first embodiment above.

Due to this, the heat generated in the semiconductor elements 2 is easily conducted to the heat conductors 3 via the intermediate jointing elements 4. Consequently, heat radiating performance is improved. Resistance to cracks in the intermediate jointing elements 4 is ensured.

(Second Variant)

Figure 6:
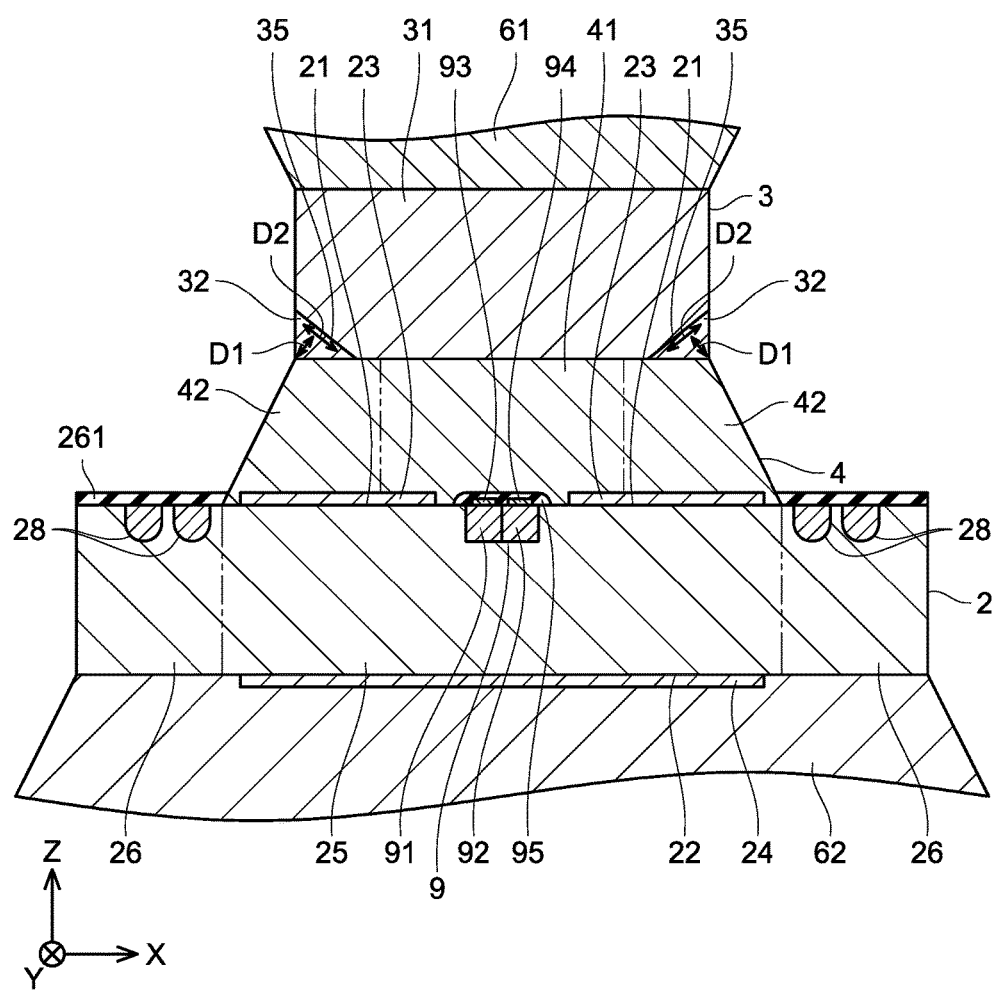
FIG. 6 is a cross-sectional view of a main part of a semiconductor device according to a second variant of the first embodiment.

As illustrated in FIG. 6, in the semiconductor device 1 according to a second variant of the first embodiment, a joint surface 35 between the metal part 31 and the graphite part 32 of the heat conductor 3 is tilted relative to the front surface 21 of the semiconductor element 2. Each graphite layer 325 of the graphite part 32 is disposed such that its first high heat-conductivity direction D1 is orthogonal to the tilted joint surface 35. Each graphite layer 325 of the graphite part 32 is disposed such that its second high heat-conductivity direction D2 is along the tilted joint surface 35.

(Third Variant)

Figure 7:
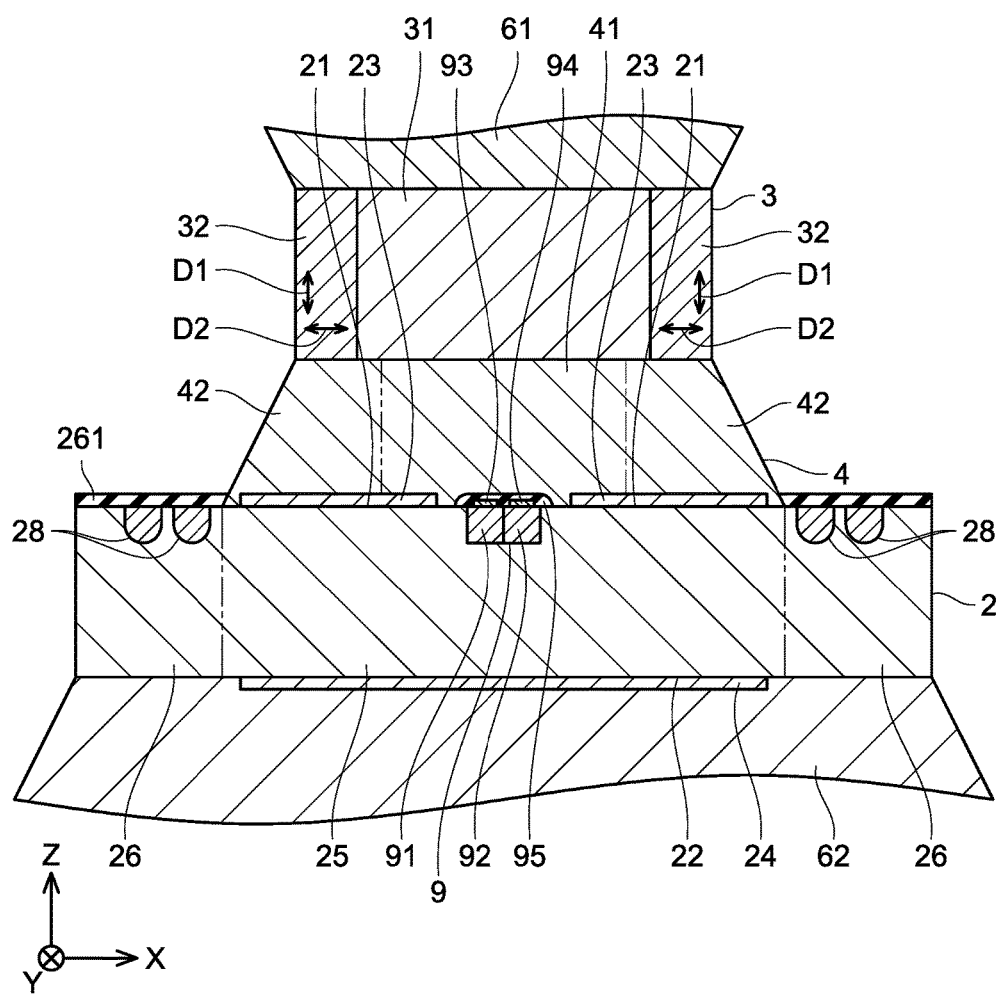
FIG. 7 is a cross-sectional view of a main part of a semiconductor device according to a third variant of the first embodiment.

As illustrated in FIG. 7, in the semiconductor device 1 according to a third variant of the first embodiment, the graphite part 32 of the heat conductor 3 surrounds the metal part 31. The metal part 31 and the graphite part 32 have the same height.

(Fourth Variant)

Figure 8:
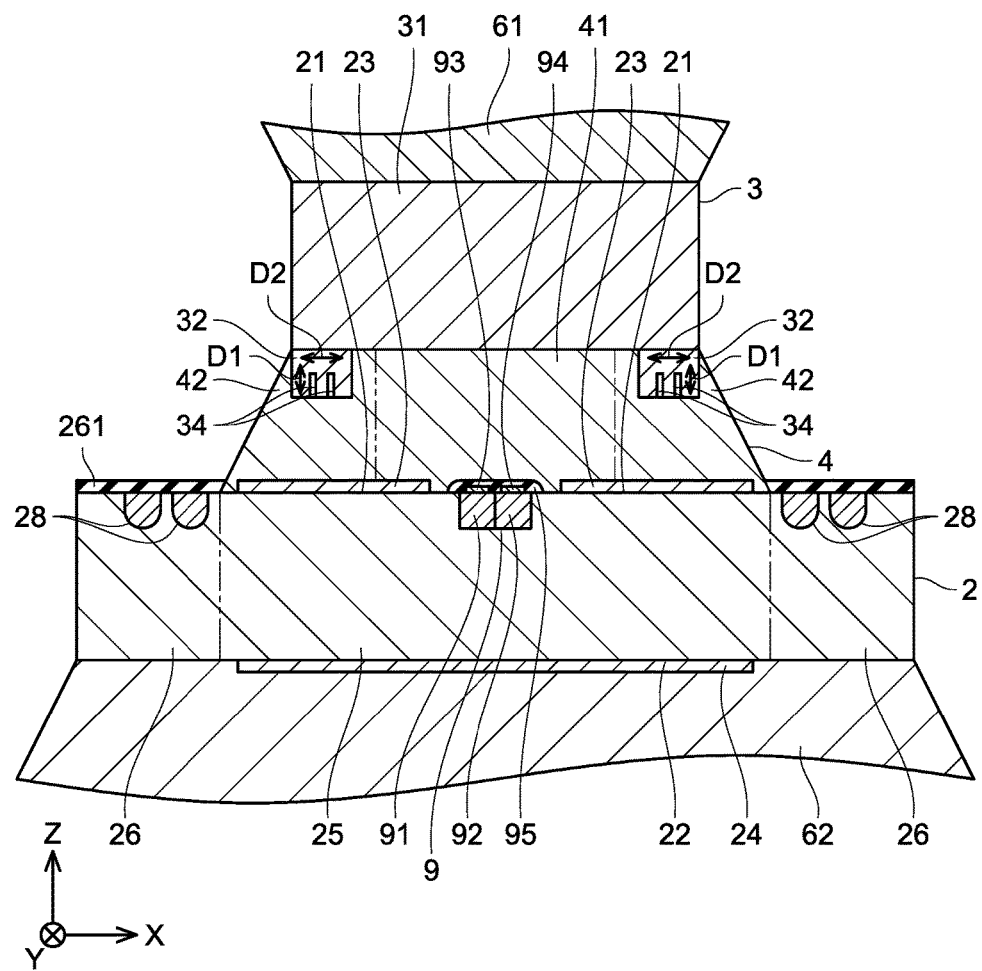
FIG. 8 is a cross-sectional view of a main part of a semiconductor device according to a fourth variant of the first embodiment.

As illustrated in FIG. 8, in the semiconductor device 1 according to a fourth variant of the first embodiment, a plurality of recesses 34 is provided in the graphite part 32 of the heat conductor 3. Each of the recesses 34 is provided in the rear surface of the graphite part 32 (surface thereof that is opposite to the surface jointed to the metal part 31). Each recess 34 extends along the perimeter direction of the metal part 31. The intermediate jointing element 4 fills each recess 34. According to this configuration, the graphite part 32 of the heat conductor 3 and the intermediate jointing element 4 can be jointed firmly. An anchor effect between the heat conductor 3 and the intermediate jointing element 4 can be enhanced.

(Fifth Variant)

Figure 9:
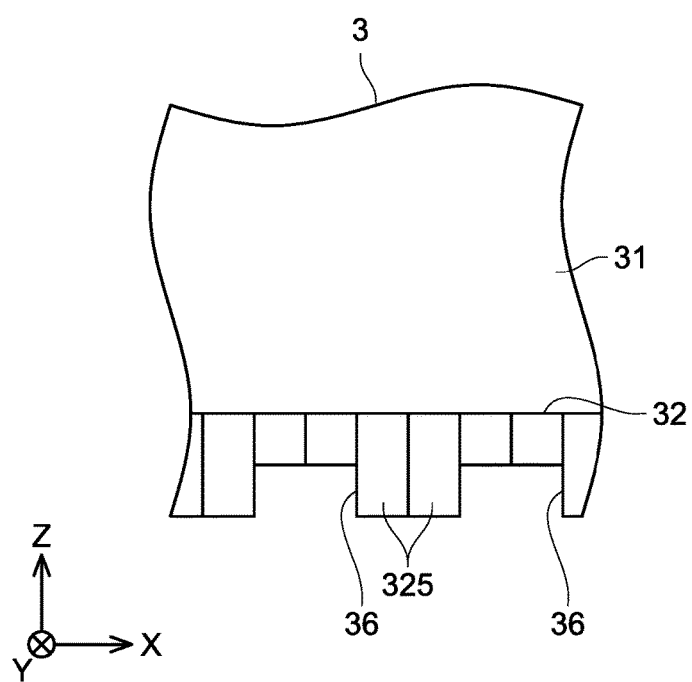
FIG. 9 is an enlarged view of a side surface of a heat conductor according to a fifth variant of the first embodiment.
Figure 10:
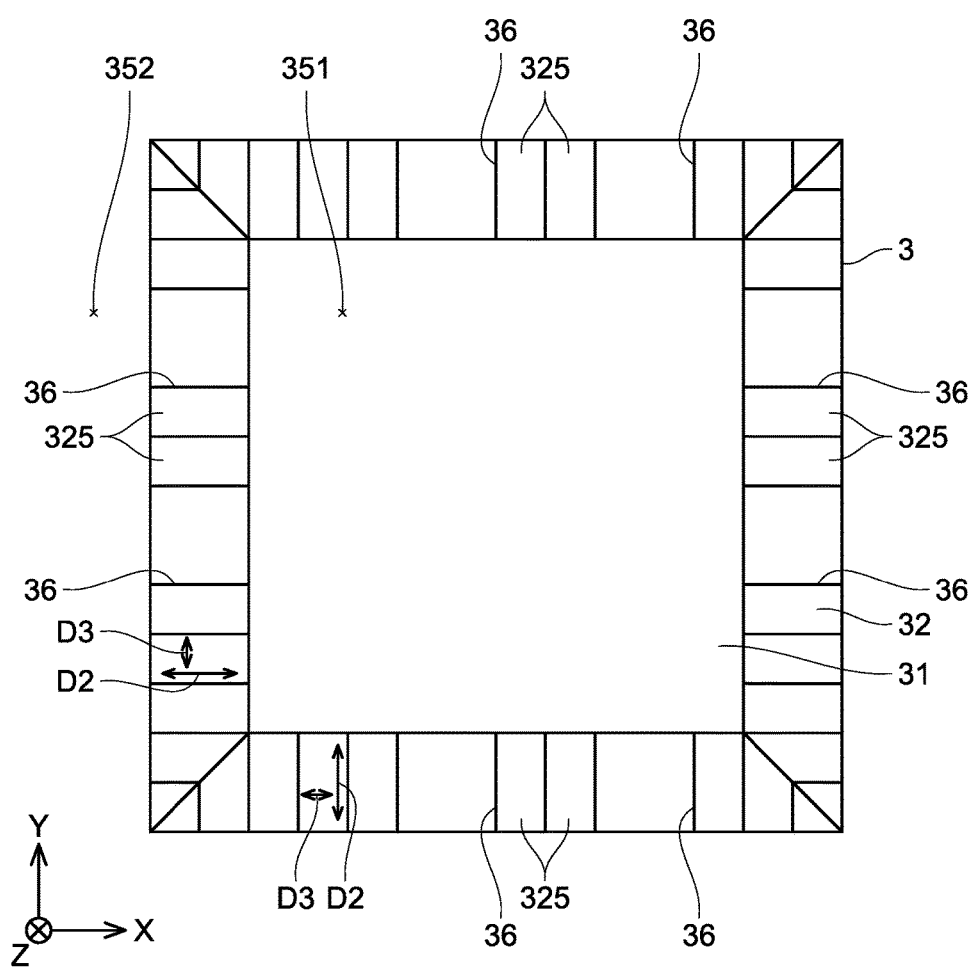
FIG. 10 is a diagram of the heat conductor according to the fifth variant of the first embodiment when viewed in a direction orthogonal to a surface of a semiconductor element (the diagram shows a rear surface of the heat conductor).

As illustrated in FIG. 9, in the semiconductor device 1 according to a fifth variant of the first embodiment, a plurality of recesses 36 is provided in the graphite part 32 of the heat conductor 3. Each of the recesses 36 is provided in the rear surface of the graphite part 32 (the surface thereof that is opposite to the surface jointed to the metal part 31). The plurality of recesses 36 is arranged along the perimeter direction of the metal part 31. Each recess 36 of the graphite part 32 extends along the direction from the central part of the metal part 31 to the peripheral part thereof. Each recess 36 links an inner portion 351 (see FIG. 10) surrounded by the graphite part 32 to an outer portion 352 (see FIG. 10) not surrounded by the graphite part 32. The intermediate jointing element 4 fills the plurality of recesses 36. When the intermediate jointing element 4 is cured, air that exists in the intermediate jointing element 4 is discharged to an outside through the recesses 36.

(Sixth Variant)

Figure 11:
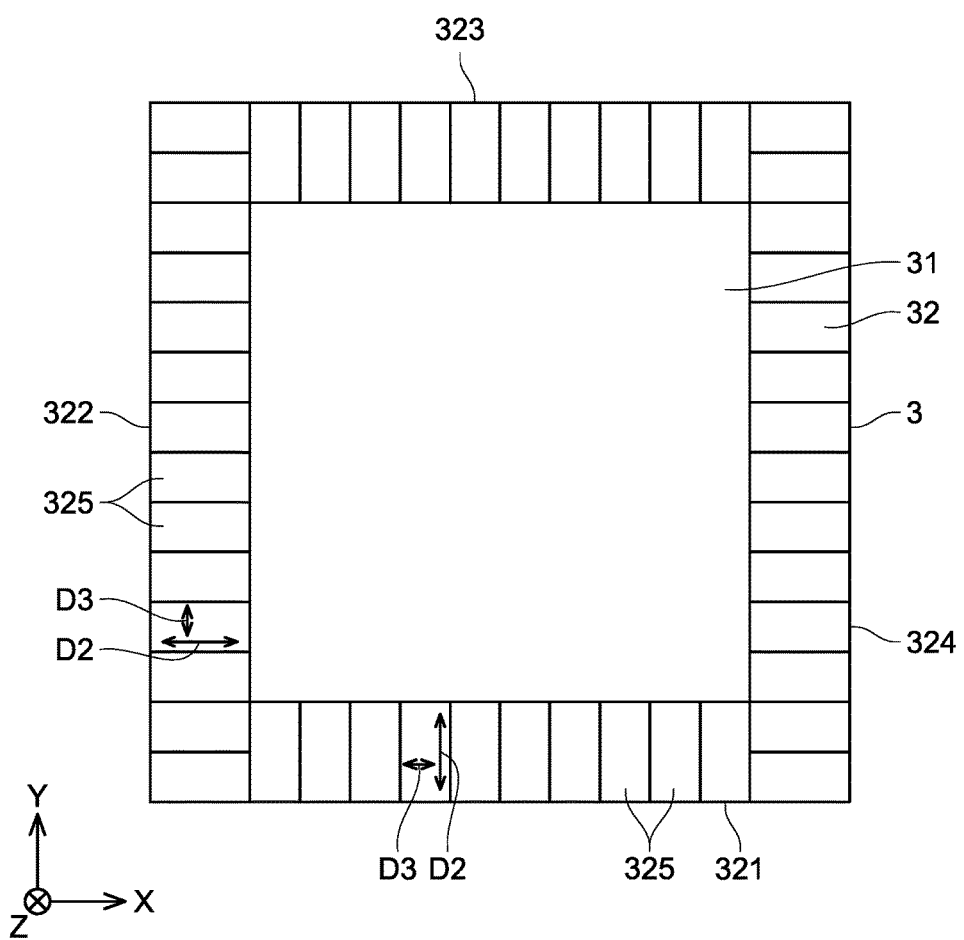
FIG. 11 is a diagram of a heat conductor according to a sixth variant of the first embodiment when viewed in a direction orthogonal to a surface of a semiconductor element (the diagram shows a rear surface of the heat conductor).

As illustrated in FIG. 11, in the semiconductor device 1 according to a sixth variant of the first embodiment, each of the members 321, 322, 323, and 324 of the graphite part 32 of the heat conductor 3 does not have its both ends cut diagonally. The second member 322 and the fourth member 324 extend from one end to the other end of the heat conductor 3 in the Y direction. The first member 321 and the third member 323 are disposed between the second member 322 and the fourth member 324. According to this configuration, since each of the members 321, 322, 323, and 324 of the graphite part 32 does not have its both end cut diagonally, the graphite part 32 can be manufactured easily.

Second Embodiment

Figure 12:
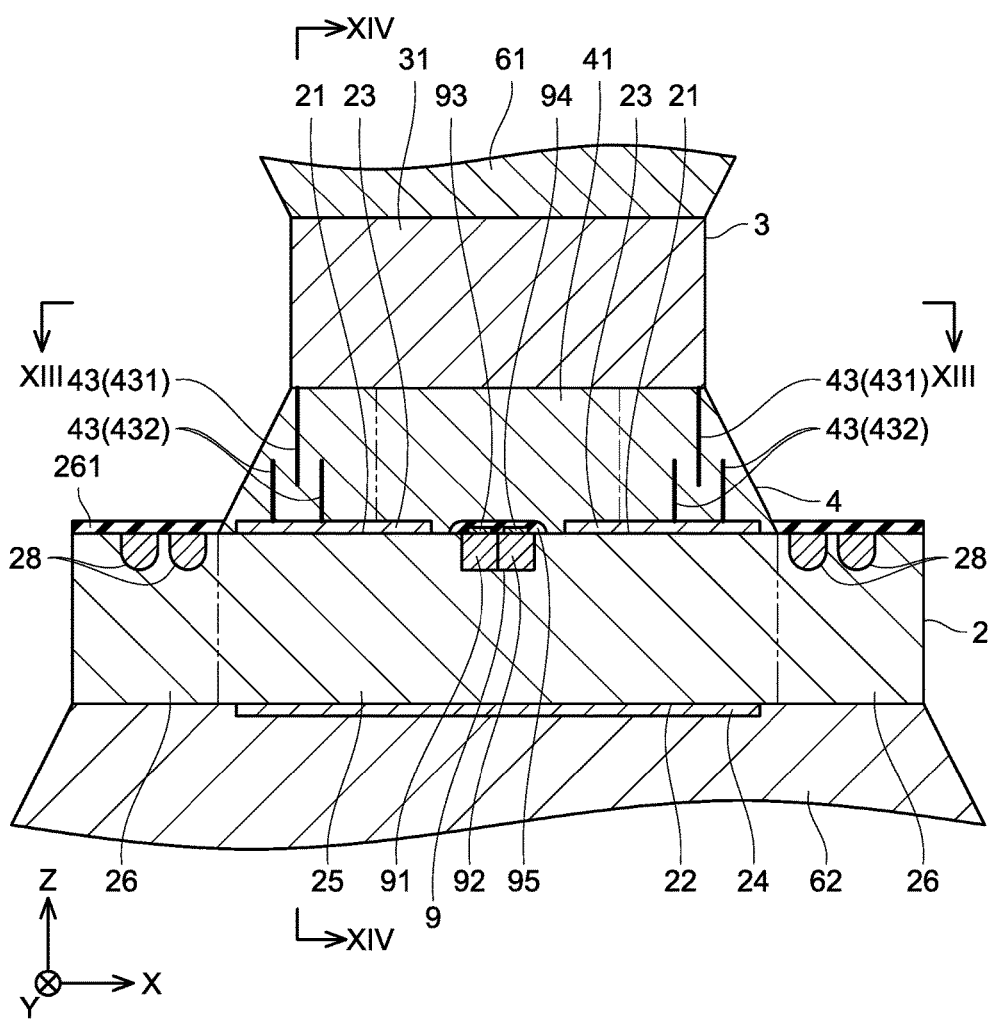
FIG. 12 is a cross-sectional view of a main part of a semiconductor device according to a second embodiment (corresponding to FIG. 2 for the first embodiment).

As illustrated in FIG. 12, the semiconductor device 1 according to a second embodiment includes a plurality of metal wires 43. The plurality of metal wires 43 is embedded in the peripheral part 42 of the intermediate jointing element 4. Each of the metal wires 43 is constituted of, for example, copper (Cu). Each metal wire 43 may be constituted of metal other than copper (Cu). Each metal wire 43 may be constituted of, for example, gold (Au) or aluminum (Al). The metal wires 43 constituted of copper (Cu) have a heat conductivity of approximately 398 W/m·K. Moreover, the metal wires 43 constituted of gold (Au) have a heat conductivity of approximately 320 W/m·K. Moreover, the metal wires 43 constituted of aluminum (Al) have a heat conductivity of approximately 238 W/m·K. Moreover, if the intermediate jointing element 4 is solder, its heat conductivity is approximately 46.5 W/m·K. The solder is, for example, SnCuNiP.

Some of the plurality of metal wires 43 are fixed to the metal part 31 of the heat conductor 3. The heat conductor 3 does not include the graphite part 32. Others of the plurality of metal wires 43 are fixed to the front surface electrodes 23. A plurality of upper metal wires 431 among the metal wires 43 is fixed to the metal part 31 of the heat conductor 3. A plurality of lower metal wires 432 among the metal wires 43 is fixed to the front surface electrodes 23. Each metal wire 43 is fixed to the metal part 31 of the heat conductor 3 or any of the front surface electrodes 23 by ball bonding or wedge bonding. The plurality of upper metal wires 431 is embedded in an upper portion of the intermediate jointing element 4. The plurality of lower metal wires 432 is embedded in a lower portion of the intermediate jointing element 4. The plurality of upper metal wires 431 is arranged in a single line. The plurality of lower metal wires 432 is arranged in two lines. A lower end portion of each of the plurality of upper metal wires 431 which are arranged in the single line is disposed between upper end portions of the plurality of lower metal wires 432 which are arranged in two lines.

Figure 13:
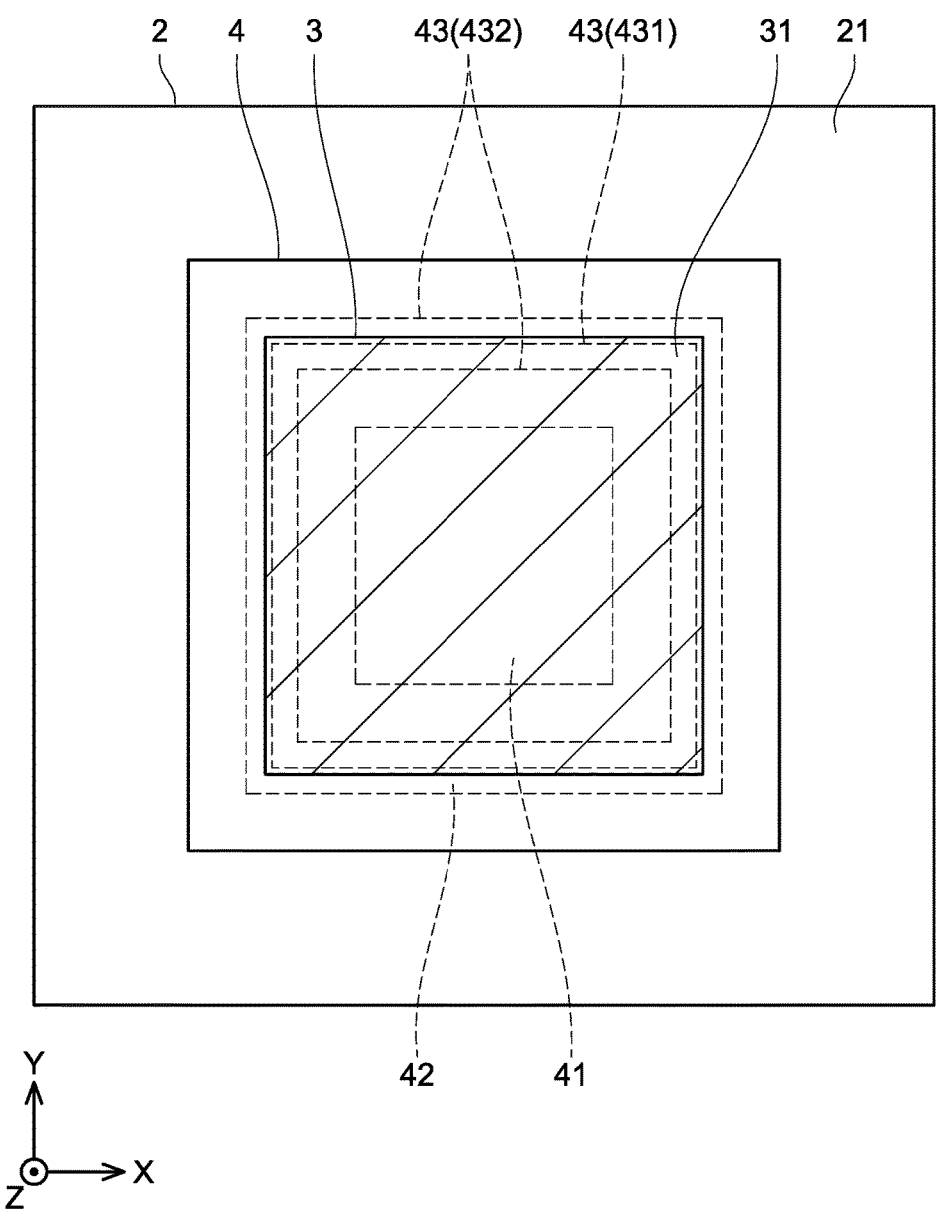
FIG. 13 is a cross-sectional view along XIII-XIII in FIG. 12.

As illustrated in FIG. 13, the plurality of metal wires 43 is arranged along the perimeter direction of the metal part 31 of the heat conductor 3 when viewed in the Z direction (the direction orthogonal to the front surface 21 of the semiconductor element 2). The plurality of metal wires 43 is arranged along the peripheral part 42 of the intermediate jointing element 4.

Figure 14:
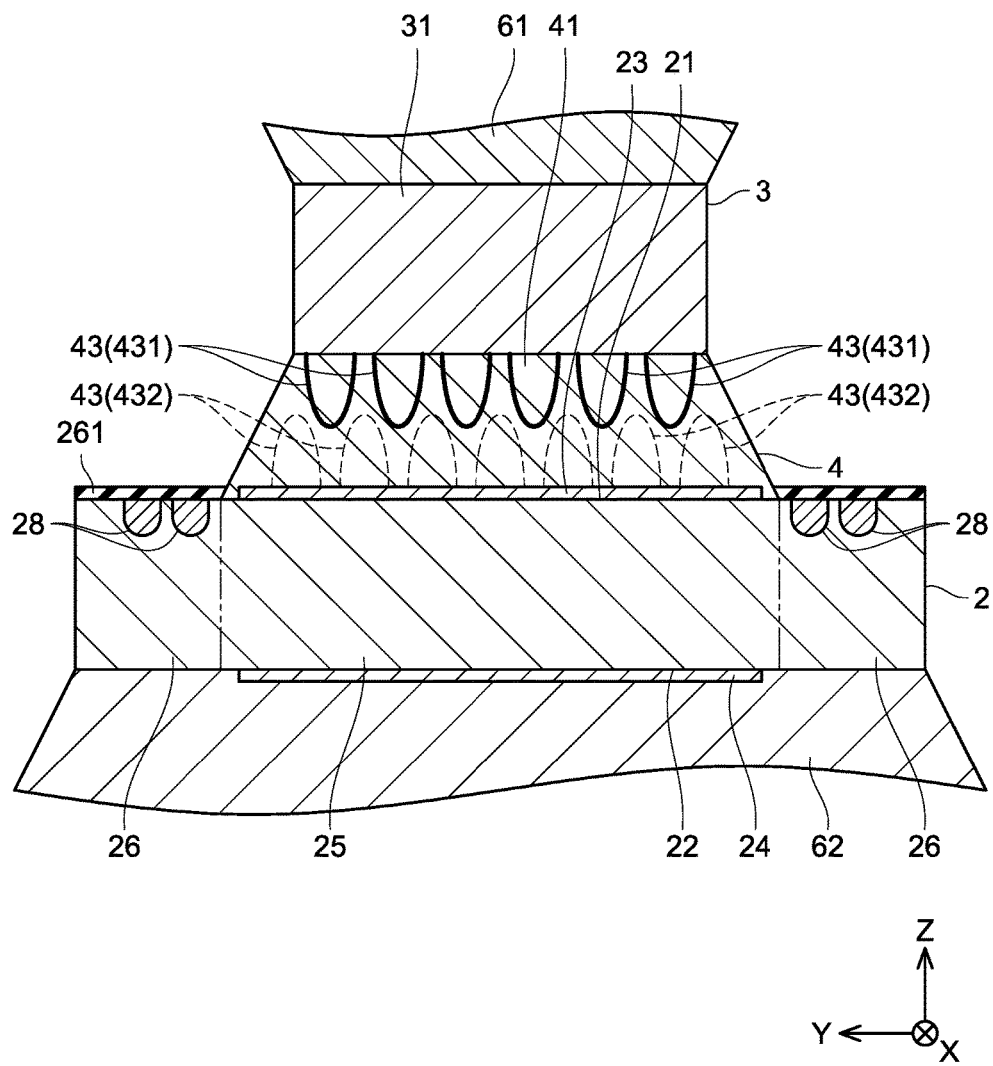
FIG. 14 is a cross-sectional view along XIV-XIV in FIG. 12.

As illustrated in FIG. 14, each metal wire 43 is curved. One end and the other end of each metal wire 431 are fixed to the metal part 31 of the heat conductor 3. One end and the other end of each lower metal wire 432 are fixed to any of the front surface electrodes 23. The upper end portion of each lower metal wire 432 is disposed between the lower end portions of the upper metal wires 431, 431 that are adjacent to each other along the perimeter direction of the metal part 31. Moreover, the lower end portion of each upper metal wire 431 is disposed between the upper end portions of the lower metal wires 432, 432 that are adjacent to each other along the perimeter direction of the metal part 31.

The semiconductor device 1 according to the second embodiment has been described above. As is clear from the description above, the semiconductor device 1 according to the second embodiment includes the plurality of metal wires 43 embedded in each intermediate jointing element 4. The plurality of metal wires 43 is arranged along the peripheral part 42 of the intermediate jointing element 4 when viewed in the Z direction (the direction orthogonal to the front surface 21 of the semiconductor element 2).

According to this configuration, when the temperature of the intermediate jointing elements 4 rises, heat in the peripheral parts 42 of the intermediate jointing elements 4 is conducted with high heat conductivity to the heat conductors 3. Because of the presence of the plurality of metal wires 43, the heat is conducted with high heat conductivity to the heat conductors 3. The temperature rise in the peripheral parts 42 of the intermediate jointing elements 4 can thereby be suppressed. Consequently, when distortion occurs in the intermediate jointing elements 4 by the temperature rise, distortion in the peripheral parts 42 of the intermediate jointing elements 4 can be suppressed. Moreover, since the temperature rise in the peripheral parts 42 of the intermediate jointing elements 4 can be suppressed, the influence on the temperature of the semiconductor elements 2 can be reduced. Therefore, the temperature of the semiconductor elements 2 can be detected accurately. Moreover, because of an anchor effect between the plurality of metal wires 43 and the intermediate jointing elements 4, distortion in the peripheral parts 42 of the intermediate jointing elements 4 can be suppressed.

(First Variant)

Figure 15:
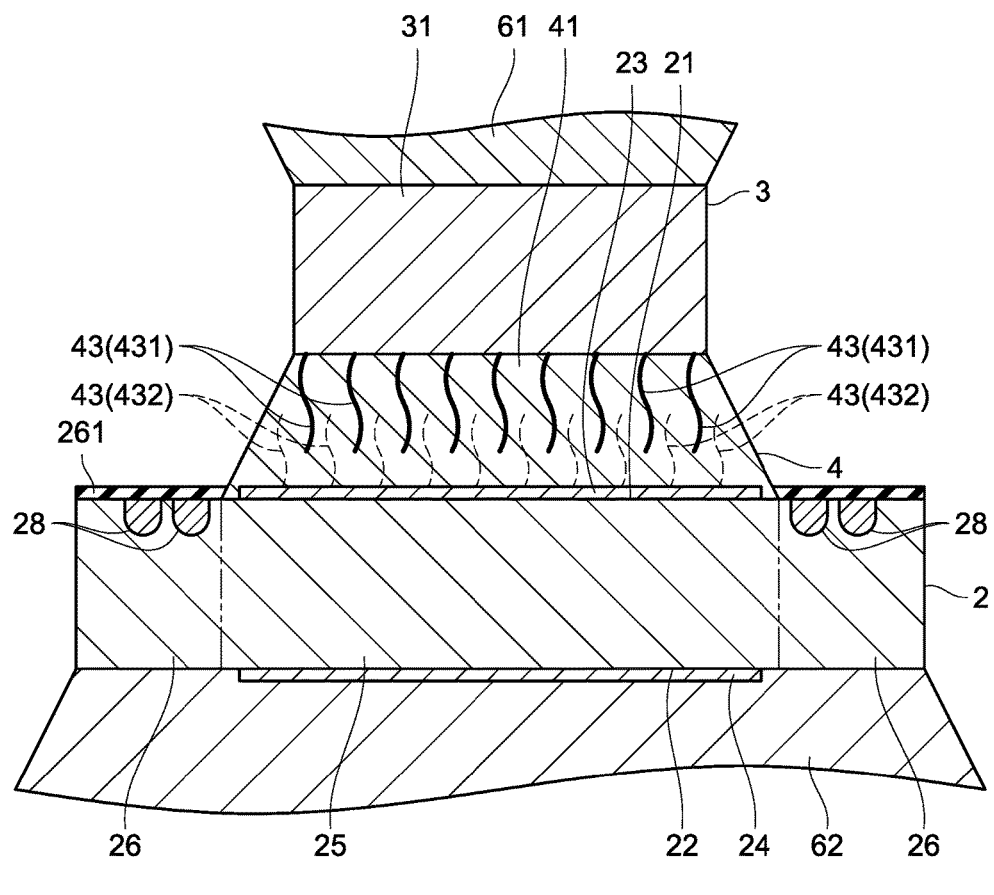
FIG. 15 is a cross-sectional view of a main part of a semiconductor device according to a first variant of the second embodiment (corresponding to FIG. 14).

As illustrated in FIG. 15, in the semiconductor device 1 according to a first variant of the second embodiment, one end of each upper metal wire 431 is fixed to the metal part 31 of the heat conductor 3. The other end of each upper metal wire 431 is not fixed to the metal part 31 of the heat conductor 3. The upper metal wires 431 extend from the metal part 31 of the heat conductor 3 toward the front surface electrodes 23. Moreover, one end of each lower metal wire 432 is fixed to any of the front surface electrodes 23. The other end of each lower metal wire 432 is not fixed to any of the front surface electrodes 23. The lower metal wires 432 extend from the front surface electrodes 23 toward the metal part 31 of the heat conductor 3. The metal wires 43 are fixed to the metal part 31 of the heat conductor 3 or the front surface electrodes 23, for example, by stud bumping.

According to this configuration, since a distance between the adjacent metal wires 43, 43 can be decreased, many metal wires 43 can be disposed in the peripheral part 42 of each intermediate jointing element 4. Heat conductivity is thereby improved, and thus the temperature rise in the peripheral parts 42 of the intermediate jointing elements 4 can further be suppressed.

(Second Variant)

The semiconductor device 1 according to a second variant of the second embodiment may not include the plurality of lower metal wires 432. The semiconductor device 1 may include a configuration of including only the plurality of upper metal wires 431. Alternatively, the semiconductor device 1 may not include the plurality of upper metal wires 431. The semiconductor device 1 may include a configuration of including only the plurality of lower metal wires 432.

(Third Variant)

Figure 16:
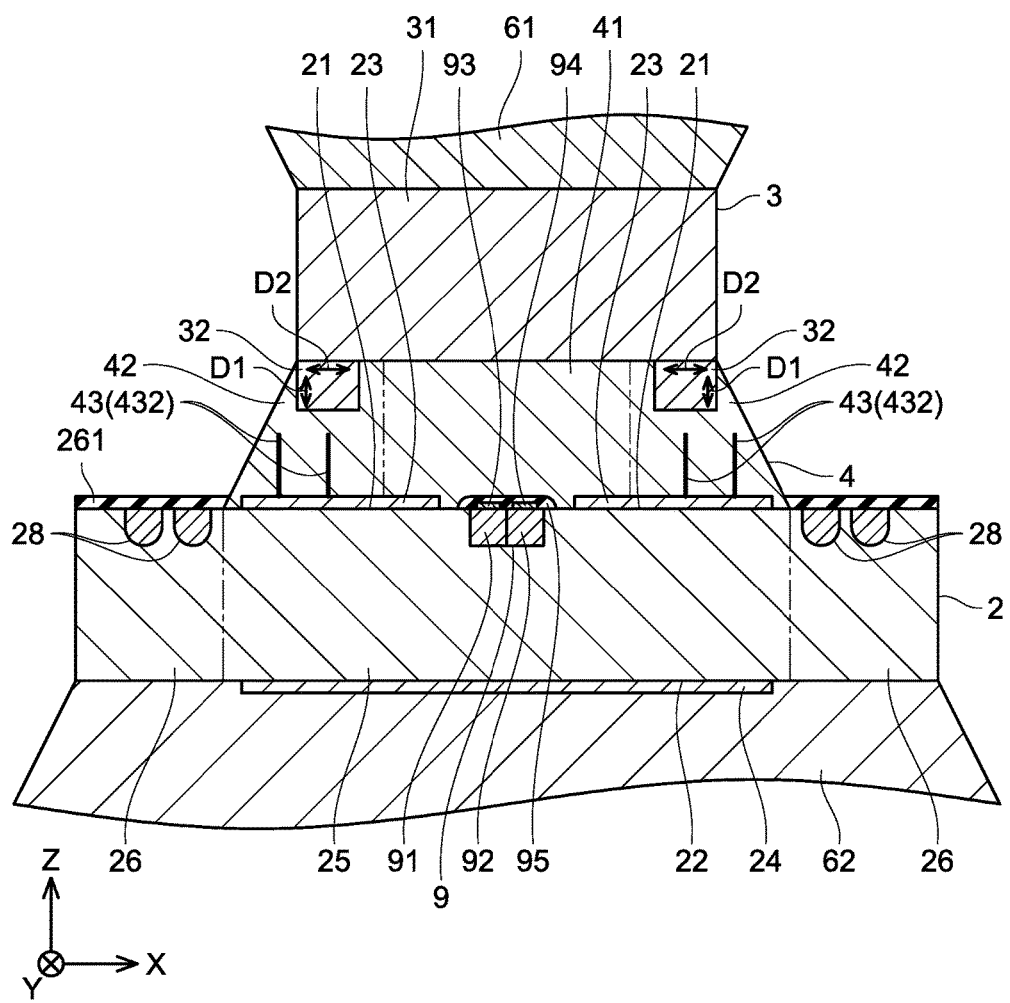
FIG. 16 is a cross-sectional view of a main part of a semiconductor device according to a third variant of the second embodiment (corresponding to FIG. 2 for the first embodiment).

As illustrated in FIG. 16, in the semiconductor device 1 according to a third variant of the second embodiment, the heat conductor 3 may include the graphite part 32. The semiconductor device 1 includes the graphite part 32 of the heat conductor 3 and the plurality of lower metal wires 432.

The distortion that occurs in the intermediate jointing elements 4 tends to be greater on a semiconductor element 2 side thereof than on a heat conductor 3 side thereof. According to the configuration in which the plurality of lower metal wires 432 is embedded in the lower portion of the intermediate jointing elements 4, the distortion of the intermediate jointing elements 4 can be suppressed by an anchor effect between the plurality of lower metal wires 432 and the intermediate jointing elements 4. Moreover, heat can be conducted with high heat conductivity by the graphite parts 32 of the heat conductors 3, so the temperature rise in the intermediate jointing elements 4 can be suppressed.

(Fourth Variant)

Figure 17:
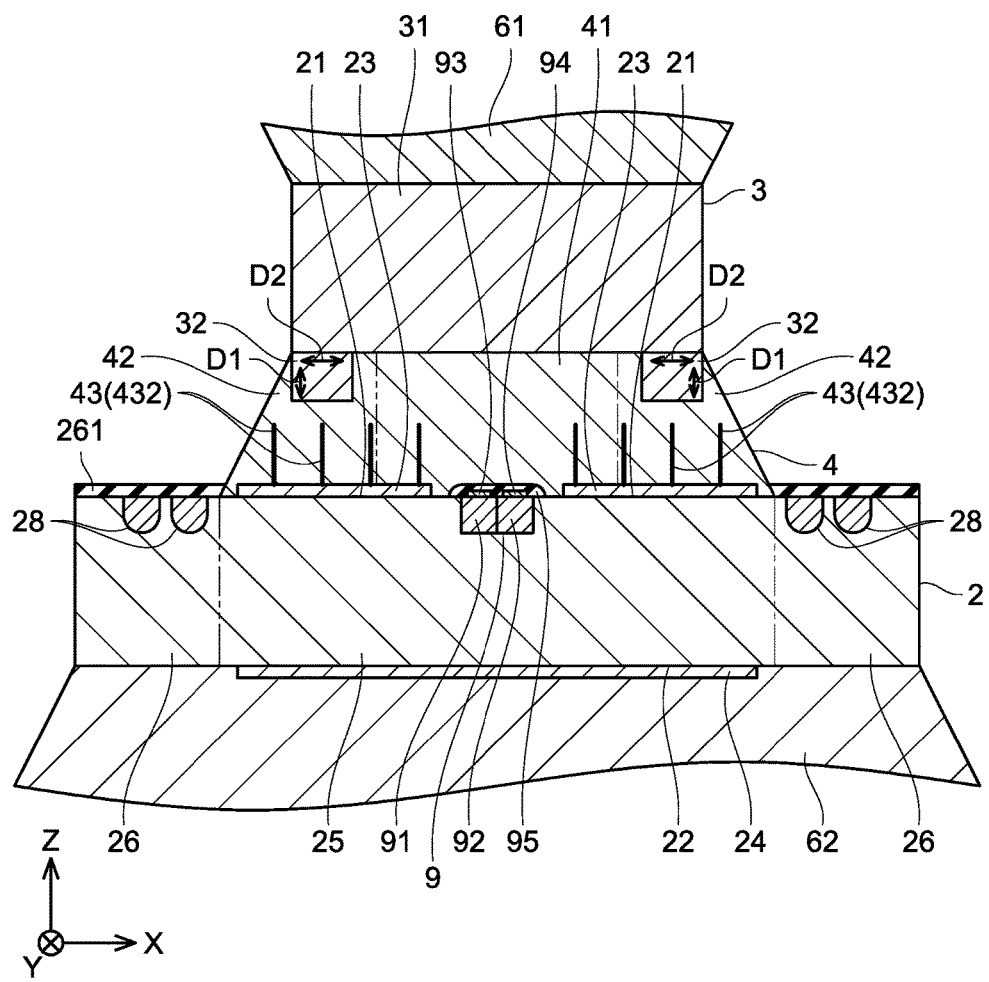
FIG. 17 is a cross-sectional view of a main part of a semiconductor device according to a fourth variant of the second embodiment (corresponding to FIG. 2 for the first embodiment).

As illustrated in FIG. 17, in the semiconductor device 1 according to a fourth variant of the second embodiment, the plurality of metal wires 43 may be embedded in the central part 41 of the intermediate jointing element 4. The plurality of lower metal wires 432 is embedded in the central part 41 and the peripheral part 42 of the intermediate jointing element 4. According to this configuration, the anchor effect between the plurality of lower metal wires 432 and the intermediate jointing element 4 can further be enhanced.

(Fifth Variant)

Figure 18:
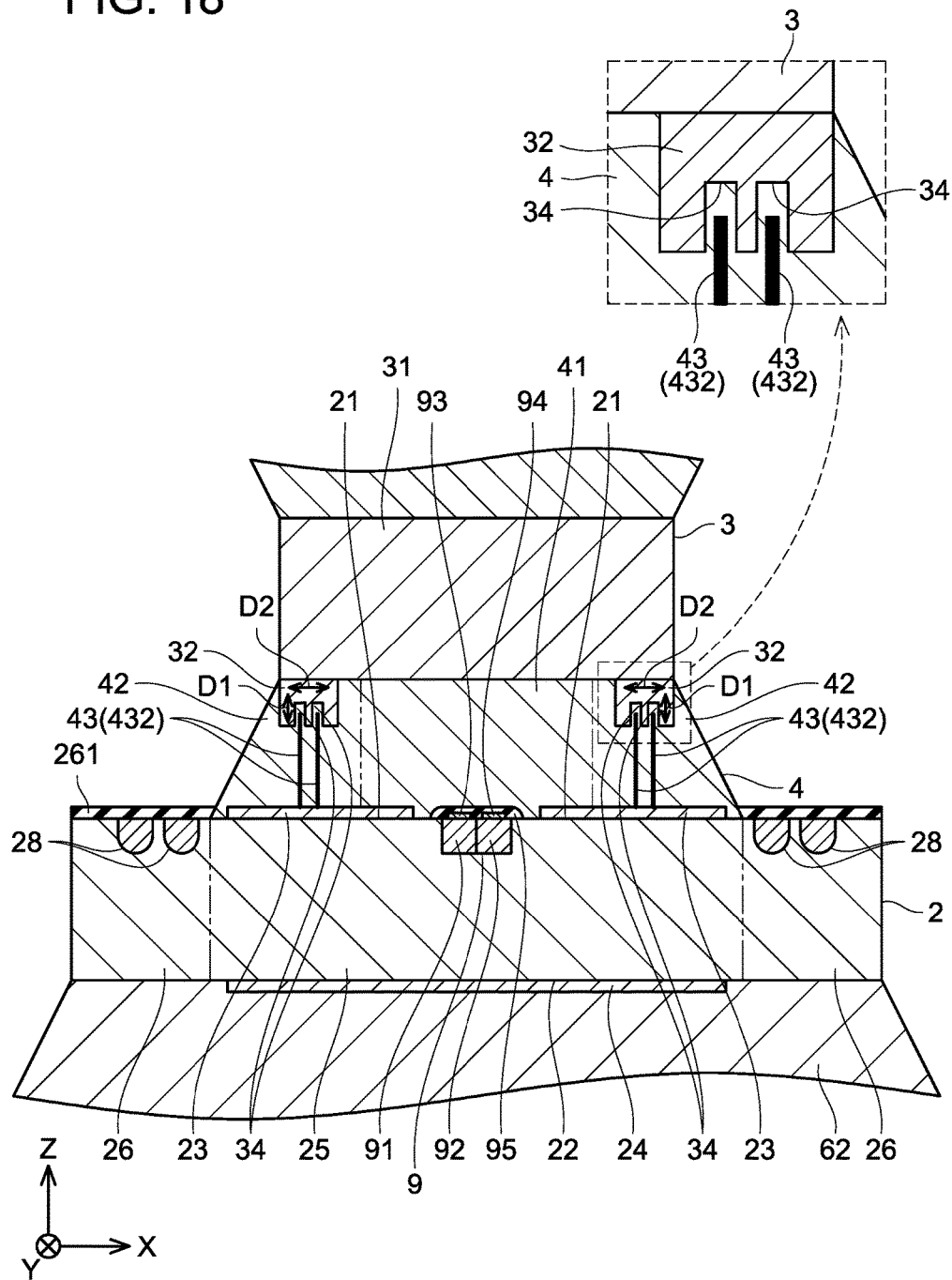
FIG. 18 is a cross-sectional view of a main part of a semiconductor device according to a fifth variant of the second embodiment (corresponding to FIG. 2 for the first embodiment).

As illustrated in FIG. 18, in the semiconductor device 1 according to a fifth variant of the second embodiment, the plurality of recesses 34 is provided in the graphite part 32 of the heat conductor 3. The upper end portions of the lower metal wires 432 are disposed in the recesses 34 of the graphite part 32. The lower metal wires 432 are disposed in each recess 34. An enlarged view of a periphery of the recesses 34 is shown at the upper-right corner of FIG. 18. Each lower metal wire 432 is separated from an inner surface of its corresponding recess 34.

What is claimed is:

1. A semiconductor device comprising:
 a semiconductor element;
 a temperature detecting element provided at a central part of a surface of the semiconductor element; and
 a heat conductor jointed to the surface of the semiconductor element via a jointing element,
 wherein
 the jointing element comprises a central part positioned over the temperature detecting element, and a peripheral part positioned on a periphery of the central part of the jointing element, and
 the heat conductor comprises a metal part being in contact with the central part of the jointing element, and a graphite part being in contact with the peripheral part of the jointing element.

2. The semiconductor device according to claim 1, further comprising:
 a plurality of metal wires embedded in the jointing element,
 wherein the plurality of metal wires is arranged along the peripheral part of the jointing element when viewed in a direction orthogonal to the surface of the semiconductor element.

3. The semiconductor device according to claim 1, wherein
 a plurality of recesses is provided in the graphite part, and
 the jointing element fills each of the recesses.

4. A semiconductor device comprising:
 a semiconductor element;
 a temperature detecting element provided at a central part of a surface of the semiconductor element;
 a heat conductor jointed to the surface of the semiconductor element via a jointing element; and
 a plurality of metal wires embedded in the jointing element,
 wherein
 the jointing element comprises a central part positioned over the temperature detecting element, and a peripheral part positioned on a periphery of the central part of the jointing element, and
 the plurality of metal wires is arranged along the peripheral part of the jointing element when viewed in a direction orthogonal to the surface of the semiconductor element.

* * * * *